United States Patent [19]

Graham

[11] Patent Number: 5,124,877
[45] Date of Patent: Jun. 23, 1992

[54] STRUCTURE FOR PROVIDING ELECTROSTATIC DISCHARGE PROTECTION

[75] Inventor: Andrew C. Graham, Sunnyvale, Calif.

[73] Assignee: Gazelle Microcircuits, Inc., Santa Clara, Calif.

[21] Appl. No.: 381,555

[22] Filed: Jul. 18, 1989

[51] Int. Cl.$^5$ .............................................. H02H 9/00
[52] U.S. Cl. ...................................... 361/212; 361/54; 361/58; 361/91
[58] Field of Search .................. 361/58, 91, 111, 117, 361/212, 54

[56] References Cited

U.S. PATENT DOCUMENTS

| | | | |
|---|---|---|---|
| 4,158,863 | 6/1979 | Naylor | 361/91 |
| 4,385,337 | 5/1983 | Asano et al. | 361/91 |
| 4,578,694 | 3/1986 | Ariizumi et al. | 361/91 |
| 4,692,781 | 9/1987 | Rountree et al. | 357/23.13 |
| 4,736,271 | 4/1988 | Mack et al. | 361/91 |
| 4,748,533 | 5/1988 | Hertrich et al. | 361/91 |
| 4,763,184 | 8/1988 | Krieger et al. | 357/23.13 |
| 4,803,527 | 2/1989 | Hatta et al. | 361/91 |
| 4,819,047 | 4/1989 | Gilfeather et al. | 361/58 |
| 4,821,089 | 4/1989 | Strasse | 357/68 |
| 4,868,705 | 9/1989 | Shiochi et al. | 361/91 |
| 4,930,036 | 5/1990 | Sitch | 361/58 |
| 4,987,465 | 1/1991 | Longcor et al. | 361/91 |
| 4,996,626 | 2/1991 | Say | 361/91 |
| 5,034,845 | 7/1991 | Morakami | 361/56 |

FOREIGN PATENT DOCUMENTS

| | | | |
|---|---|---|---|
| 2407333 | 9/1974 | Fed. Rep. of Germany | 361/91 |
| 0132097 | 8/1978 | Fed. Rep. of Germany | 361/91 |
| 3422995 | 11/1985 | Fed. Rep. of Germany | 361/91 |
| 0094716 | 4/1989 | Japan | 361/91 |
| 0181317 | 7/1989 | Japan | 361/91 |
| 1188824 | 10/1985 | U.S.S.R. | 361/91 |

OTHER PUBLICATIONS

"Signal Driver Having Overvoltage Protection" by O. J. Bodendorf et al., IBM Tech. Disclosure Bulletin, vol. 17 No. 5, Oct. 1974.

*Primary Examiner*—Steven L. Stephan
*Assistant Examiner*—Thomas M. Dougherty
*Attorney, Agent, or Firm*—Skjerven, Morrill, MacPherson, Franklin, & Friel

[57] ABSTRACT

In one embodiment, the threshold voltage of the electrostatic protection circuit is selectively raised above the power supply voltage by the inclusion of a plurality of serially connected diodes connected between the power supply voltage and a discharge reference rail. The serially connected diodes become forward biased when a voltage applied to the rail is above the power supply voltage by a voltage equal to the sum of the various voltage drops across the serially connected diodes.

The various input pads of the integrated circuit are connected to an anode of an associated diode, wherein the cathode of the associated diode is connected to the discharge reference rail, rather than directly to $V_{DD}$ as in the prior art. The anodes of each of these diodes are also connected to the device to be protected within the integrated circuit. Thus, when a voltage applied to the input pad is approximately one diode drop above the discharge reference rail, the voltage at the input pad will be shunted to the power supply voltage generator through the serially connected diodes.

18 Claims, 3 Drawing Sheets

STRUCTURE FOR PROVIDING ELECTROSTATIC DISCHARGE PROTECTION

FIELD OF THE INVENTION

This invention relates to circuits for protecting against damage caused by electrostatic discharge, and in particular, to a circuit which provides a selectable trigger threshold level above a supply voltage level.

BACKGROUND OF THE INVENTION

Electrostatic discharge pulses are a well known phenomenon and can be generated by any of a number of causes. These pulses, which can be several thousand volts, are known to destroy integrated circuits and especially integrated circuits incorporating field effect transistors (FETs). Accordingly, integrated circuits frequently provide some sort of protective circuit for preventing high voltages applied to an input pad from reaching an input to a device to be protected, such as an input buffer. An example of a prior art circuit for protecting against electrostatic discharge is shown in FIG. 1, where diodes D1 and D2 prevent voltages from being applied to an input buffer which are significantly above power supply voltage $V_{DD}$ or significantly below ground potential. In the example of FIG. 1, if a positive electrostatic pulse is applied to input pad 10, this high voltage will be shunted to the supply voltage through diode D1 so that the maximum voltage appearing at node 1 will be approximately the supply voltage plus the diode drop of diode D1. Resistor R1 connected between node 1 and input pad 10 serves to limit current through diode D1. Any negative voltages applied to input pad 10 will be shunted to ground through diode D2.

In some cases a manufacturer or a user of an integrated circuit may want to apply a voltage to an input pad which is significantly above the power supply voltage in order to enable various test functions of the integrated circuit which are otherwise unaccessible by applying normal input levels to the input pads. In this case, the electrostatic discharge protection circuit of FIG. 1 could not be utilized in the integrated circuit since any voltage significantly above power supply voltage $V_{DD}$ would forward bias diode D1 and prevent node 1 from rising significantly above power supply voltage $V_{DD}$. A different structure is needed which will allow input levels to be driven high enough above $V_{DD}$ to enable other test modes, but will still provide sufficient protection against positive electrostatic discharge pulses applied to the input.

SUMMARY OF THE INVENTION

The present invention is an electrostatic discharge protection circuit for enabling a voltage significantly above a power supply voltage to be applied to a device to be protected within an integrated circuit. In one embodiment, the threshold voltage of the electrostatic protection circuit is selectively raised above the power supply voltage by the inclusion of a plurality of serially connected diodes connected between the power supply voltage and a discharge reference rail. The serially connected diodes become forward biased when a voltage applied to the rail is above the power supply voltage by a voltage equal to the sum of the various voltage drops across the serially connected diodes.

The various input pads of the integrated circuit are connected to an anode of an associated diode, wherein the cathode of the associated diode is connected to the discharge reference rail, rather than directly to $V_{DD}$ as in the prior art. The anodes of each of these diodes are also connected to the device to be protected within the integrated circuit. Thus, when a voltage applied to the input pad is approximately one diode drop above the discharge reference rail, the voltage at the input pad will be shunted to the power supply voltage generator through the serially connected diodes.

In one embodiment, a resistor is connected between the input pad and the anode of the associated diode to limit current through the associated diode. Further in this embodiment, a cathode of a second associated diode is connected to the resistor, and an anode of this diode is connected to ground to shunt to ground any negative voltage applied to input pad 10.

Thus, using this invention allows a designer to incorporate an electrostatic discharge protection circuit in an integrated circuit while enabling voltages to be applied to the various input pads significantly higher than the power supply voltage.

DETAILED DESCRIPTION OF THE INVENTION

Figure 1:
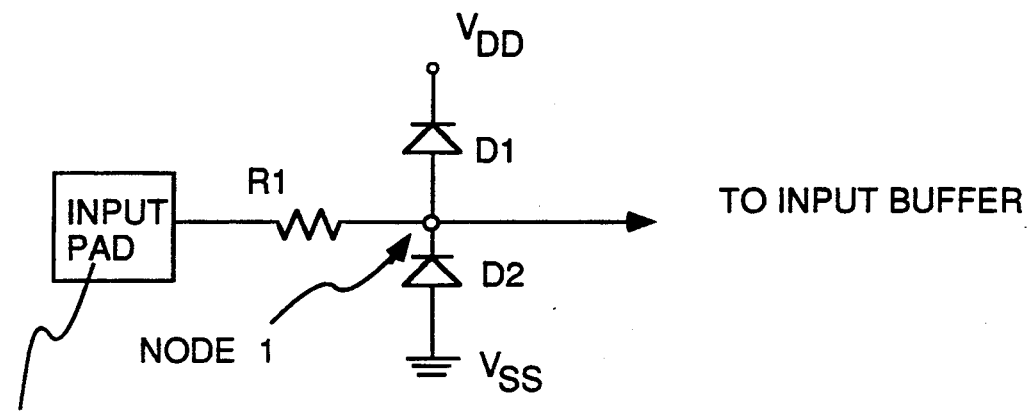
FIG. 1 shows a simple prior art electrostatic discharge protection circuit.
Figure 2:
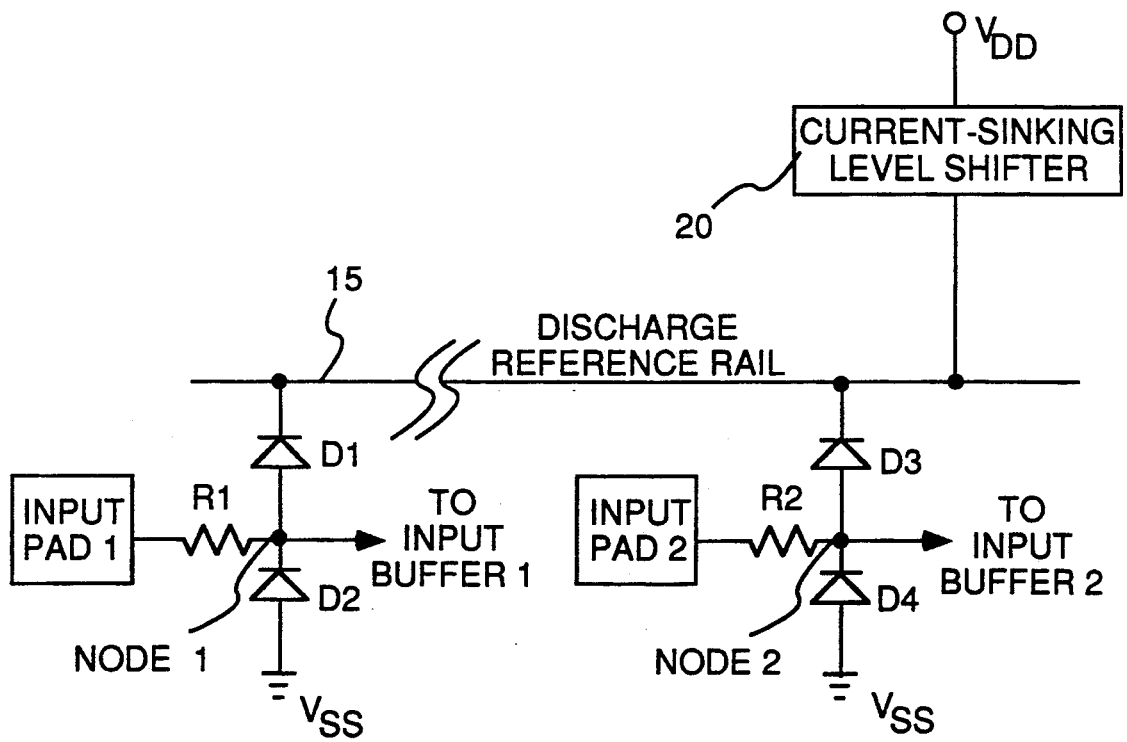
FIG. 2 shows one embodiment of the present invention.

FIG. 2 shows one embodiment of the present invention, wherein input pad 1 is coupled to an associated input buffer 1 via series resistor R1. Also shown is input pad 2 coupled to input buffer 2 through series resistor R2. In accordance with the invention of FIG. 2, the voltage at node 1 is prevented from being raised greater than one diode drop above the voltage on discharge reference rail 15 so as to prevent any undesirably high voltage from being applied to the input buffer. As described with respect to the prior art protection circuit of FIG. 1, as the voltage at node 1 of the circuit of FIG. 2 becomes sufficient to forward bias diode D1, current from node 1 will flow through diode D1 and will be shunted away from input buffer 1 in order to protect input buffer 1 from the high voltage.

The threshold voltage sufficient to forward bias diode D1 is made selectively higher than power supply voltage $V_{DD}$ by connecting current sinking level shifter 20 between power supply voltage $V_{DD}$ and discharge reference rail 15. Level shifter 20 operates to effectively raise the reference voltage on discharge reference rail 15 selectively above power supply voltage $V_{DD}$ so as to selectively raise the threshold voltage at node 1 well above power supply voltage $V_{DD}$.

Diode D2 coupled between node 1 and ground potential operates to shunt current through ground when a voltage applied to input pad 1 is more negative than approximately 0.7 volts below ground potential.

Diodes D3 and D4, associated with input pad 2, perform identically as diodes D1 and D2, respectively.

Resistors R1 and R2, connected between the input pads and their associated input buffers, are optional, although they are preferred to restrict current flow through the diodes.

Figure 3:
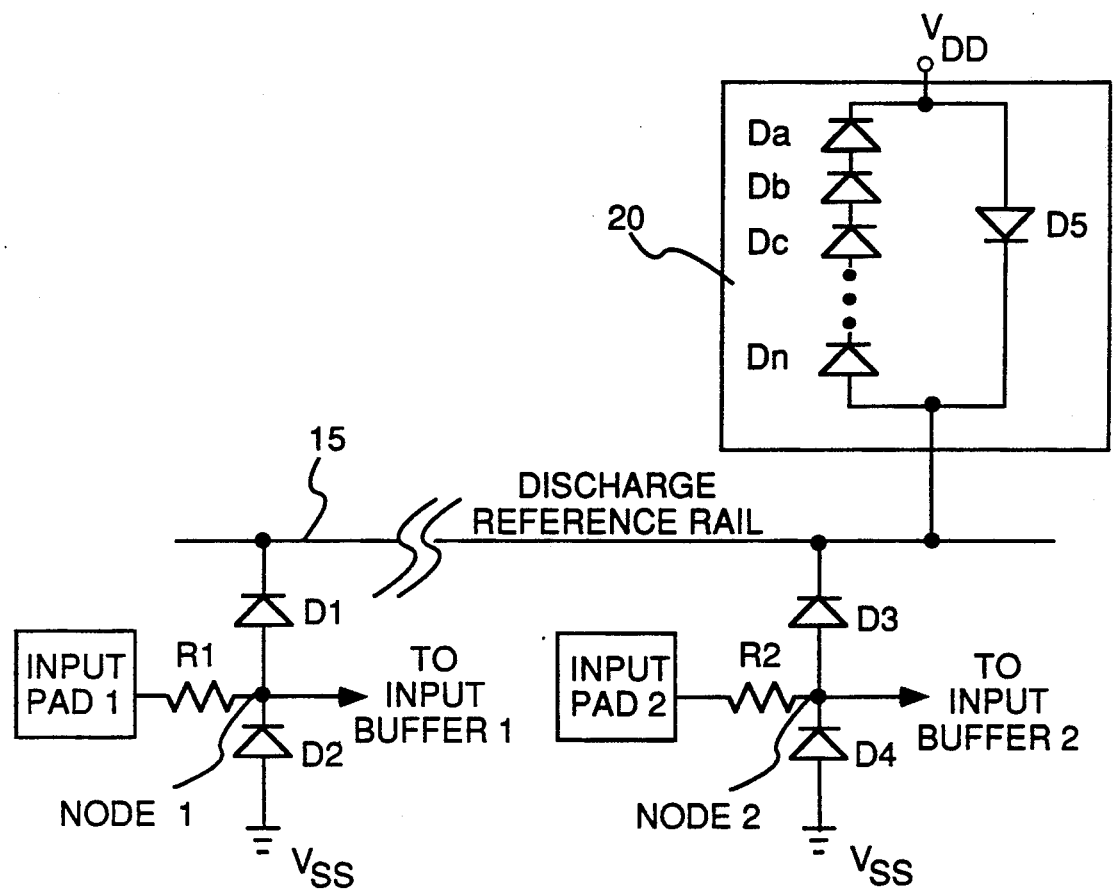
FIG. 3 shows an embodiment of the present invention wherein serially connected diodes provide a selected threshold voltage.

FIG. 3 shows one embodiment of current sinking level shifter 20, wherein level shifter 20 comprises serially connected diodes $D_a$–$D_n$, where an anode of diode $D_n$ is connected to discharge reference rail 15 and a cathode of diode $D_a$ is connected to power supply voltage $V_{DD}$. Thus, the voltage at node 1 necessary to forward bias diode D1 is approximately equal to the power supply voltage $V_{DD}$ plus the sum of the diode drops across diodes $D_a$–$D_n$ and D1.

Since input pad 2 is coupled to discharge reference rail 15 through diode D3, node 2 coupled to input buffer 2 will have an identical threshold voltage as node 1.

Diodes D2 and D4 prevent the voltages at node 1 and 2, respectively, from extending significantly below ground potential.

In FIG. 3, diode D5, having its anode connected to power supply voltage $V_{DD}$ and its cathode connected to discharge reference rail 15, serves to maintain discharge reference rail 15 at $V_{DD}$ minus one diode drop during normal operation of the integrated circuit to prevent discharge reference rail 15 from floating low and to prevent the forward biasing of diodes D1 and D3 during normal operation of the circuit (i.e., when the voltage at input pads 1 and 2 is between $V_{DD}$ and ground).

It will be readily understood by one of ordinary skill in the art that other forms of level shifting means may be used for level shifter 20. In an alternative embodiment, shown in FIG. 4, one or more zener diodes $D_{Z1}$–$D_{Zn}$ may be serially connected so that zener diodes $D_{Z1}$–$D_{Zn}$ will break down when a voltage on node 1 or node 2 of FIG. 2 exceeds a voltage equal to the sum of the zener diode voltages plus the forward voltage drop across diode D1 or D3.

Figure 4:
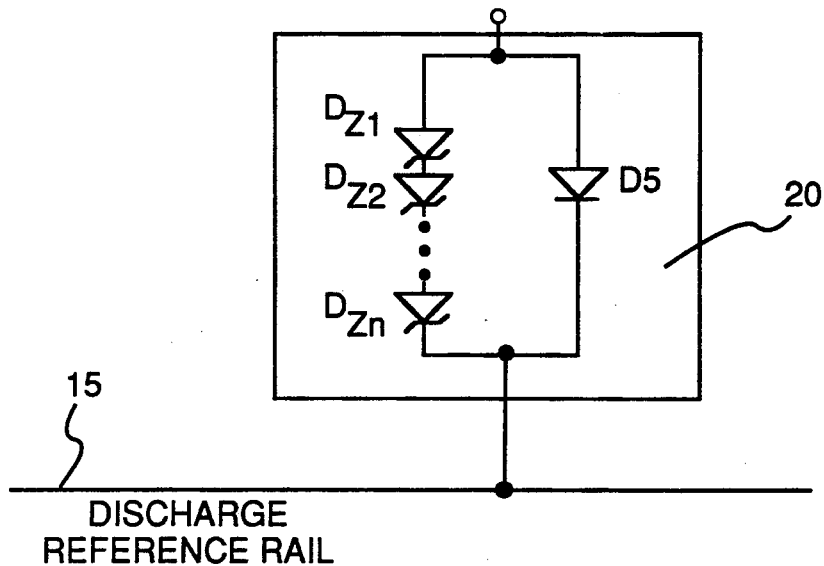
FIG. 4 shows an embodiment of the present invention wherein serially connected zener diodes provide a selected threshold voltage.

In one embodiment of the protective circuit of FIGS. 2-4, level shifter 20 provides a voltage drop between approximately 5 volts to 15 volts.

Figure 5:
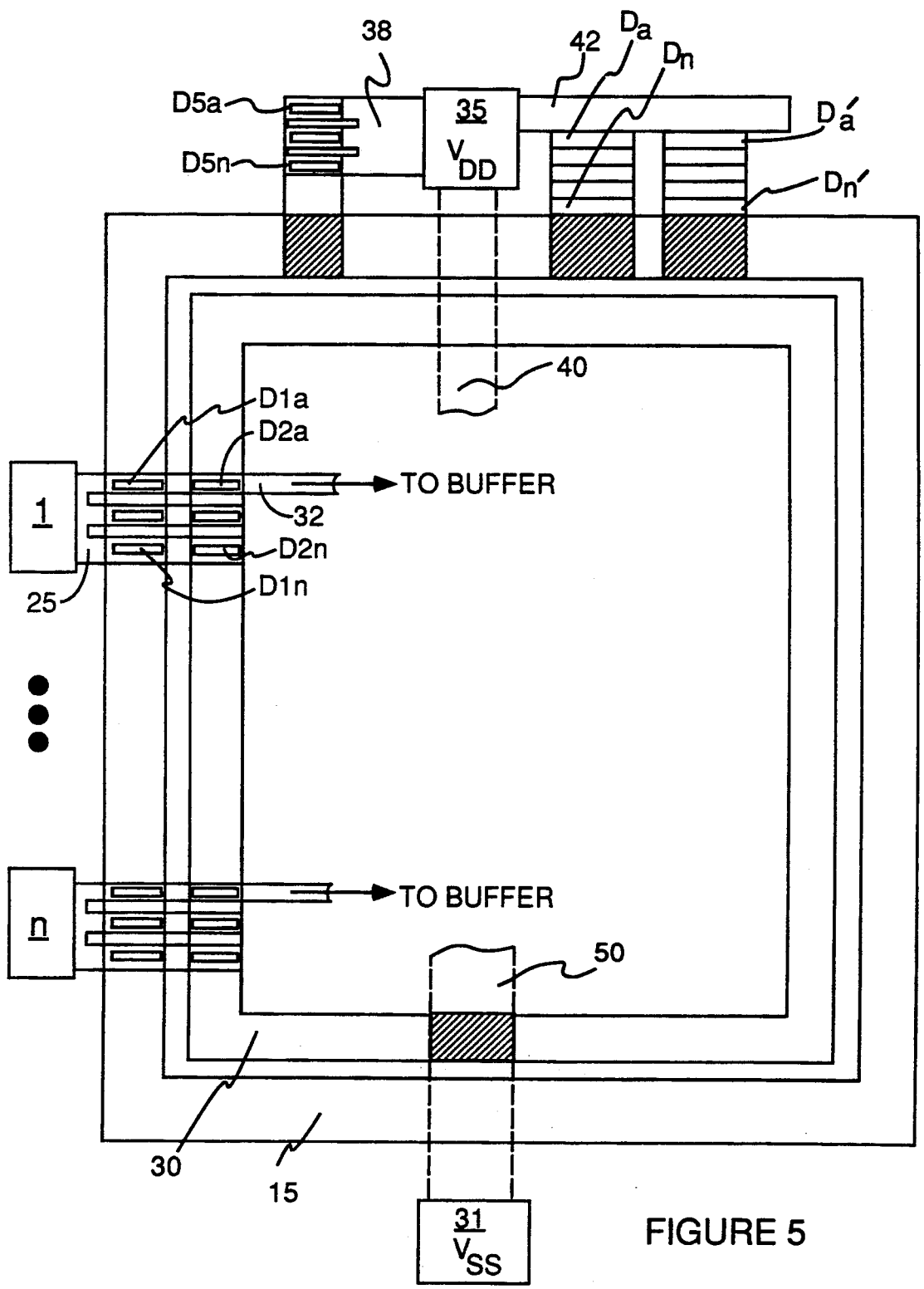
FIG. 5 shows a preferred embodiment of an integrated circuit structure incorporating the present invention.

FIG. 5 illustrates a preferred embodiment of an integrated circuit incorporating the invention. In FIG. 5, input pad 1 is coupled via conductor 25 to the anodes of parallel diodes $D1_a$–$D1_n$, where common cathodes of these parallel diodes are coupled to discharge reference rail 15, which is formed overlying diodes $D1_a$–$D1_n$. Diodes $D1_a$–$D1_n$ perform an identical function as diode D1 in FIG. 3.

Similarly, input pad 1 is coupled via conductor 25 to the cathodes of parallel diodes $D2_a$–$D2_n$, formed under ground potential rail 30, where common anodes of diodes $D2_a$–$D2_n$ are coupled to ground potential rail 30. Diodes $D2_a$–$D2_n$ perform an identical function as diode D2 in FIG. 3.

A conductor 32 extending from input pad 1 then couples input pad 1 to an associated input buffer (not shown).

A similar configuration is used by each of the remaining input pads to connect the pads to rails 15 and 30, through the associated two diodes, and to its associated input buffer.

As seen in FIG. 5, discharge reference rail 15 and ground potential rail 30, coupled to ground potential $V_{SS}$ via input pad 31, effectively enclose the portion of the integrated circuit protected by the electrostatic discharge protective circuit.

Also shown in FIG. 5 is the preferred embodiment of the current sinking level shifter 20, shown in FIG. 3, incorporated into an integrated circuit. In FIG. 5, input pad 35 is coupled to an external voltage source supplying power supply voltage $V_{DD}$. Input pad 35 is coupled via conductor 38 to the anodes of parallel diodes $D5_a$–$D5_n$, equivalent to diode D5 in FIG. 3. The common cathodes of diodes $D5_a$–$D5_n$ are then coupled to discharge reference rail 15 so as to prevent discharge reference rail 15 from floating significantly below power supply voltage $V_{DD}$.

Series coupled diodes $D_a$–$D_n$, performing a function identical as diodes $D_a$–$D_n$ in FIG. 3, are shown with the cathode of diode $D_a$ coupled to power supply voltage rail 42 and with the anode of diode $D_n$ coupled to discharge reference rail 15. Serial diodes $D_a$–$D_n$ are connected in parallel with series coupled diodes $D_a'$–$D_n'$ to increase the current handling capability of the level shifter.

Ground rail 30 can be shared with other internal circuitry requiring ground connection by coupling this circuitry to ground conductor 50. Also, the level shifter, coupling $V_{DD}$ to rail 15, is shared by many input pads. Thus, very little die area is required to provide electrostatic discharge protection for each input buffer associated with an input pad.

Thus, as shown, a novel electrostatic discharge protection circuit for providing a threshold voltage selectively higher than the positive power supply voltage is disclosed herein which may be fabricated inexpensively and without requiring a significant amount of die area. All diodes may be Schottky diodes or may comprise any other diode means. Also, level shifter 20, shown in FIG. 2, may comprise any number of the various types of means used by one of ordinary skill in the art to create a voltage drop.

Other embodiments and applications of the invention will become obvious to those of ordinary skill in the art. However, the invention is intended to encompass any modification of the invention which uses the various broad concepts taught with respect to the preferred embodiments.

What is claimed is:

1. A protective circuit for coupling between an input terminal and a first circuit for protecting said first circuit from certain voltages applied to said input terminal, said protective circuit comprising:

a first diode means having an anode coupled to said input terminal and having a cathode coupled to a discharge reference rail; and a current sinking level shifter means coupled between said discharge reference rail and a first terminal, said first terminal for providing a first potential, said level shifter means providing a high conductance path between said discharge reference rail and said first terminal when said first diode is forward biased by a voltage applied to said input terminal which is of a more positive voltage than said first potential by a selected amount.

2. The protective circuit of claim 1 further comprising a second diode means having a cathode connected to said input terminal and having an anode connected to a second terminal, said second terminal for providing a second potential.

3. A protective circuit for coupling between an input terminal and a first circuit for protecting said first circuit from certain voltages applied to said input terminal, said protective circuit comprising:

a first diode means having an anode coupled to said input terminal and having a cathode coupled to a discharge reference rail; and a current sinking level shifter means coupled between said discharge reference rail and a first terminal, said first terminal for providing a first potential, said level shifter means causing said first diode to be forward biased by a voltage applied to said input terminal which is of a more positive voltage than said first potential by a selected amount, wherein said level shifter means comprises one or more diodes connected serially between said first terminal and said discharge reference rail, wherein said one or more diodes become forward biased when a voltage applied to said input terminal exceeds a combined voltage drop across said one or more diodes and said first diode above said first potential.

4. A protective circuit for coupling between an input terminal and a first circuit for protecting said first circuit from certain voltages applied to said input terminal, said protective circuit comprising:

a first diode means having an anode coupled to said input terminal and having a cathode coupled to a discharge reference rail; and a current sinking level shifter means coupled between said discharge reference rail and a first terminal, said first terminal for providing a first potential, said level shifter means causing said first diode to be forward biased by a voltage applied to said input terminal which is of a more positive voltage than said first potential by a selected amount, wherein said level shifter means comprises one or more serially connected zener diodes connected between said first terminal and said discharge reference rail, wherein a voltage applied to said input terminal is shunted to said first terminal when said voltage applied to said input terminal exceeds a combined breakdown voltage of said zener diodes plus a voltage drop of said first diode above said first potential.

5. The protective circuit of claim 3 wherein said level shifter means further comprises a diode means having an anode connected to said first terminal and a cathode connected to said discharge reference rail.

6. The protective circuit of claim 4 wherein said level shifter means further comprises a diode means having an anode connected to said first terminal and having a cathode connected to said discharge reference rail.

7. The protective circuit of claim 5 further comprising a resistor coupling said input terminal to said anode of said first diode means.

8. The protective circuit of claim 6 further comprising a resistor coupling said input terminal to said anode of said first diode means.

9. An integrated circuit having one or more input bond pads, said bond pads being coupled to electronic circuitry internal to said integrated circuit, said integrated circuit characterized in that:

said integrated circuit includes an electrostatic discharge protection circuit coupled to said one or more input bond pads, said electrostatic discharge protection circuit comprising:

a first diode means associated with each of said input bond pads, each of said first diode means having an anode coupled to its associated input bond pad and having a cathode coupled to a discharge reference rail; and a current sinking level shifter means coupled between said discharge reference rail and a first terminal, said first terminal for providing a first potential, said level shifter means providing a high conductance path between said discharge reference rail and said first terminal when said first diode associated with an input bond pad is forward biased by a voltage applied to said associated input bond pad which is of a more positive voltage than said first potential by a selected amount.

10. The protection circuit of claim 9 further comprising a second diode means associated with each of said input bond pads, each of said second diode means having a cathode connected to its associated input bond pad and having an anode connected to a second terminal, said second terminal for providing a second potential.

11. An integrated circuit having one or more input bond pads, said bond pads being coupled to electronic circuitry internal to said integrated circuit, said integrated circuit characterized in that:

said integrated circuit includes an electrostatic discharge protection circuit coupled to said one or more input bond pads, said electrostatic discharge protection circuit comprising:

a first diode means associated with each of said input bond pads, each of said first diode means having an anode coupled to its associated input bond pad and having a cathode coupled to a discharge reference rail; and a current sinking level shifter means coupled between said discharge reference rail and a first terminal, said first terminal for providing a first potential, said level shifter means causing said first diode associated with an input bond pad to be forward biased by a voltage applied to said associated input bond pad which is of a more positive voltage than said first potential by a selected amount, wherein said level shifter means comprises one or more diodes connected serially between said first terminal and said discharge reference rail, wherein one or more diodes become forward biased when a voltage applied to one of said input bond pads exceeds a combined voltage drop across said one or more diodes and said first diode associated with said one of said bond pads above said first potential.

12. An integrated circuit having one or more input bond pads, said bond pads being coupled to electronic circuitry internal to said integrated circuit, said integrated circuit characterized in that:

said integrated circuit includes an electrostatic discharge protection circuit coupled to said one or more input bond pads, said electrostatic discharge protection circuit comprising:

a first diode means associated with each of said input bond pads, each of said first diode means having an anode coupled to its associated input bond pad and having a cathode coupled to a discharge reference rail; and a current sinking level shifter means coupled between said discharge reference rail and a first terminal, said first terminal for providing a first potential, said level shifter means causing said first diode associated with an input bond pad to be forward biased by a voltage applied to said associated input bond pad which is of a more positive voltage than said first potential by a selected amount, wherein said level shifter means comprises one or more serially connected zener diodes connected between said first terminal and said discharge reference rail, wherein a voltage applied to one of said input bond pads is shunted to said first terminal when said voltage applied to said one of said input bond pads exceeds a combined breakdown voltage of said zener diodes plus a voltage drop of said first diode associated with said one of said bond pads above said first potential.

13. The protection circuit of claim 11 wherein said level shifter means further comprises a diode means having an anode connected to said first terminal and a cathode connected to said discharge reference rail.

14. The protection circuit of claim 12 wherein said level shifter means further comprises a diode means having an anode connected to said first terminal and having a cathode connected to said discharge reference rail.

15. The protection circuit of claim 13 further comprising a resistor coupling each of said input bond pads to said anode of said first diode means associated with each of said input bond pads.

16. The protection circuit of claim 14 further comprising a resistor coupling each of said input bond pads to said anode of said first diode means associated with each of said input bond pads.

17. The circuit of claims 1, 2, 3, 4, 5, 6, 7, 8, 9, 10, 11, 12, 13, 14, 15, or 16 wherein said first potential is provided by a positive power supply.

18. The circuit of claims 2 or 10 where said second potential is a ground potential.

* * * * *